(12) United States Patent
Bateman et al.

(10) Patent No.: US 9,722,129 B2
(45) Date of Patent: Aug. 1, 2017

(54) COMPLEMENTARY TRAVELING MASKS

(71) Applicant: Varian Semiconductor Equipment Associates, Inc., Gloucester, MA (US)

(72) Inventors: Nicholas P T Bateman, Reading, MA (US); Benjamin Riordan, Newburyport, MA (US); William T. Weaver, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 118 days.

(21) Appl. No.: 14/616,907

(22) Filed: Feb. 9, 2015

(65) Prior Publication Data
US 2015/0228842 A1 Aug. 13, 2015

Related U.S. Application Data

(60) Provisional application No. 61/938,904, filed on Feb. 12, 2014.

(51) Int. Cl.
*H01L 31/18* (2006.01)
(52) U.S. Cl.
CPC ..... *H01L 31/18* (2013.01); *H01J 2237/31711* (2013.01)
(58) Field of Classification Search
CPC .............. H01J 2237/31711; H01J 2237/31706
See application file for complete search history.

(56) References Cited

U.S. PATENT DOCUMENTS

| 7,727,866 | B2 | 6/2010 | Bateman et al. |
| 7,820,460 | B2 | 10/2010 | Sullivan et al. |
| 2009/0142875 | A1 | 6/2009 | Borden et al. |
| 2010/0308236 | A1* | 12/2010 | Carlson ............... H01J 37/3171 250/492.3 |
| 2011/0139229 | A1 | 6/2011 | Rohatgi et al. |
| 2011/0139230 | A1 | 6/2011 | Rohatgi et al. |
| 2012/0100666 | A1 | 4/2012 | Gee et al. |

(Continued)

FOREIGN PATENT DOCUMENTS

| WO | 2011/074909 A2 | 6/2011 |
| WO | 2011/100363 A1 | 8/2011 |
| WO | 2011100383 A1 | 8/2011 |

OTHER PUBLICATIONS

International Search Report and Written Opinion mailed May 11, 2015 in corresponding PCT application No. PCT/US2015/015204.

*Primary Examiner* — Kimberly Rizkallah
*Assistant Examiner* — Mounir Amer
(74) *Attorney, Agent, or Firm* — Nields, Lemack & Frame, LLC

(57) ABSTRACT

A method of processing a solar cell is disclosed, where a chained patterned ion implant is performed to create a workpiece having a lightly doped surface having more heavily doped regions. This configuration may be used in various embodiments, such as for selective emitter solar cells. Additionally, various mask sets that can be used to create this desired pattern are also disclosed. The mask set may include one or more masks that have an open portion and a patterned portion, where the union of the open portions of the masks comprises the entirety of the surface to be implanted. The patterned portions of the masks combine to create the desired pattern of heavily doped regions.

15 Claims, 6 Drawing Sheets

(56) References Cited

U.S. PATENT DOCUMENTS

2013/0008494 A1\* 1/2013 Bateman .......... H01L 21/26586
 136/255
2013/0186457 A1\* 7/2013 Kwag .................. H01L 31/068
 136/255

\* cited by examiner

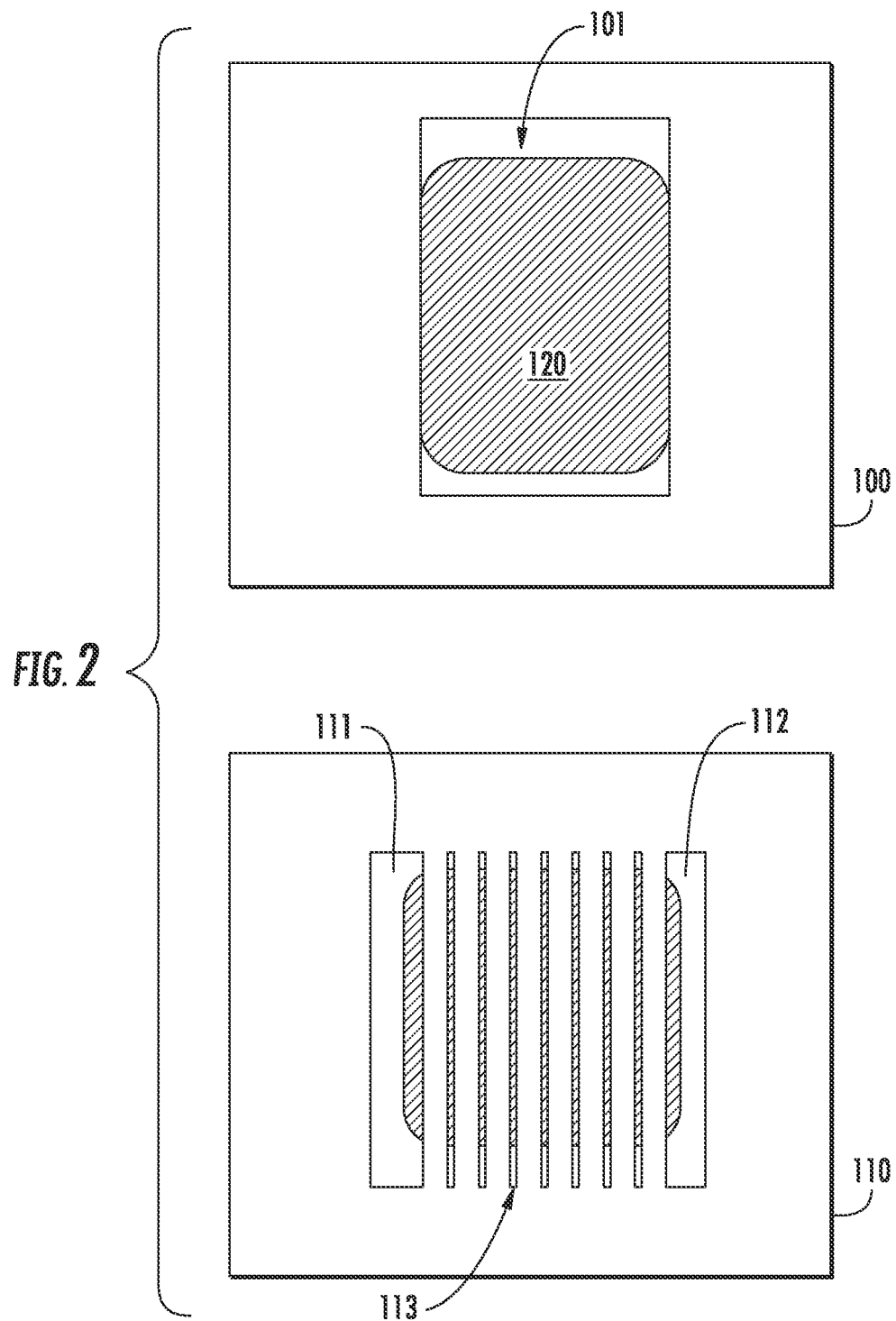

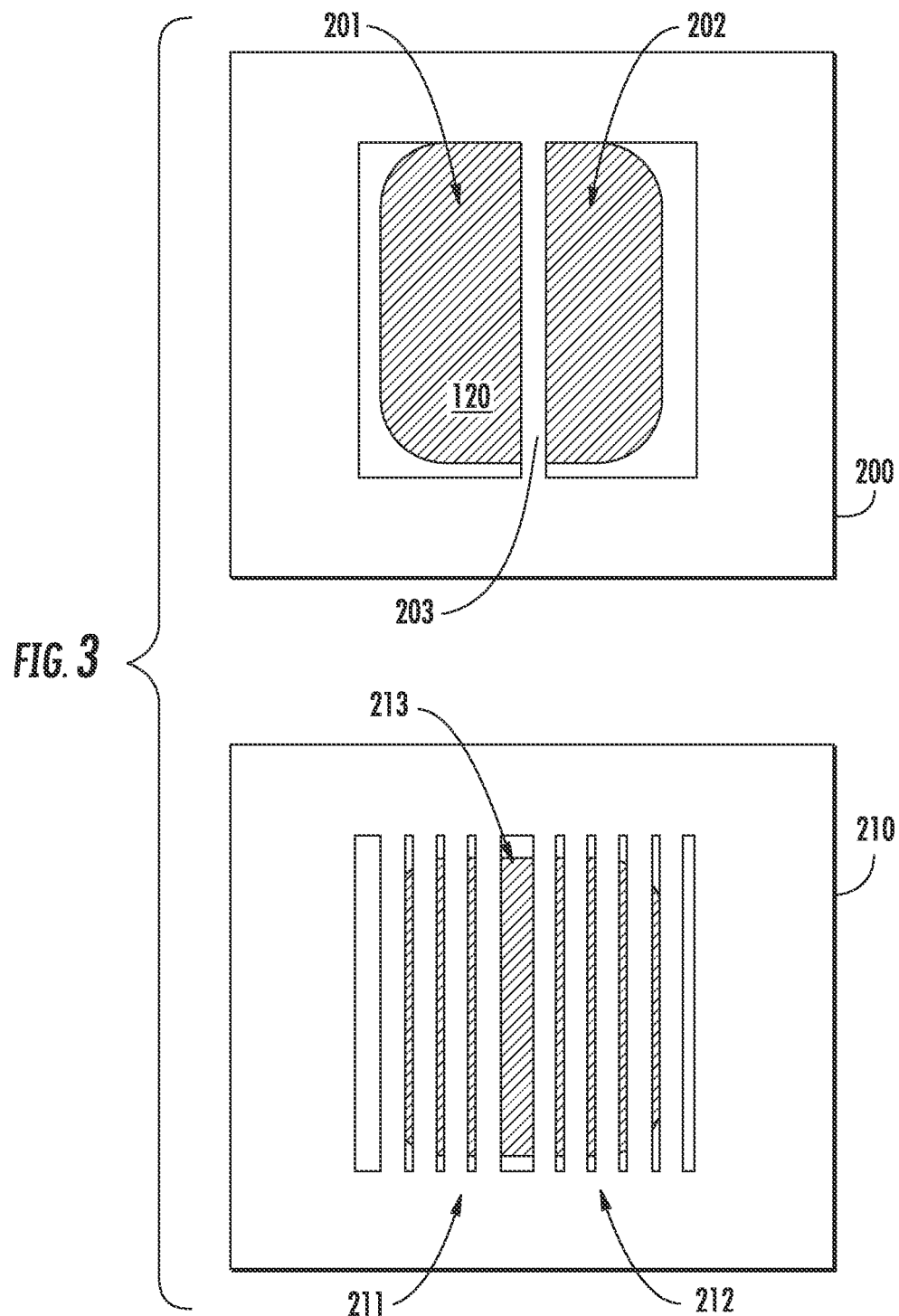

COMPLEMENTARY TRAVELING MASKS

This application claims priority of U.S. Provisional Patent Application Ser. No. 61/938,904, filed Feb. 12, 2014, the disclosure of which is incorporated herein by reference in its entirety.

FIELD

Embodiments of the present disclosure relate to methods for implanting dopants into solar cells, and more particularly, methods of creating a selective emitter surface.

BACKGROUND

Semiconductor workpieces are often implanted with dopant species to create a desired conductivity. For example, solar cells may be implanted with a dopant species to create an emitter region. This implant may be done using a variety of different mechanisms. The creation of an emitter region allows the formation of a p-n junction in the solar cell. As light strikes the solar cells, electrons are energized, creating electron-hole pairs. The minority carriers, which are created by the energy from incident light, are swept across the p-n junction in the solar cell. This creates a current, which can be used to power an external load.

In some embodiments, one surface of the workpiece is doped so that the entire, or substantially the entire surface has a first concentration of dopant. Portions of that surface are more heavily doped to create regions where metal contacts may be attached. In some embodiments, this configuration is used to create a selective emitter solar cell. In this configuration, the workpiece beneath the metal contacts is heavily doped to insure good contact resistance and to shield the metal contacts from minority carriers. The rest of the surface, which is lightly doped, minimizes Auger recombination of minority carriers.

Ion implantation may be used to create this selective emitter surface using a plurality of implants. Therefore, a method of ion implanting that efficiently creates a workpiece with a lightly doped surface with regions of higher doping would be beneficial.

SUMMARY

A method of processing a solar cell is disclosed, where a chained patterned ion implant is performed to create a workpiece having a lightly doped surface having more heavily doped regions. This configuration may be used in various embodiments, such as for selective emitter solar cells. Additionally, various mask sets that can be used to create this desired pattern are also disclosed. The mask set may include one or more masks that have an open portion and a patterned portion, where the union of the open portions of the masks comprises the entirety of the surface to be implanted. The patterned portions of the masks combine to create the desired pattern of heavily doped regions.

In one embodiment, a method of processing a workpiece is disclosed. The method comprises performing a plurality of patterned ion implants into a surface of the workpiece so as to create a lightly doped surface having a pattern of more heavily doped regions. In certain embodiments, the plurality of patterned ion implants are performed without breaking vacuum of an implant apparatus used to perform the plurality of patterned ion implants. In certain embodiments, the performing comprises implanting ions into the workpiece using a first mask and implanting ions into the workpiece using a second mask, different from the first mask, where the first mask and the second mask each comprises an open portion through which ions may pass and at least one of the first mask and the second mask comprises a patterned portion, and where a union of the open portion of the first mask and the open portion of the second mask comprises an entirety of the surface of the workpiece. In a further embodiment, the entirety of the surface is lightly doped by ions passing through the open portions and the more heavily doped regions are formed by ions passing through the patterned portions.

In another embodiment, a mask set for implanting a surface of a workpiece is disclosed. Each mask of the mask set comprises an open portion, and at least one mask in the mask set comprises a patterned portion, wherein after the workpiece is implanted using each mask of the mask set, an entirety of the surface of the workpiece is lightly doped and a pattern of more heavily doped regions is formed on the surface of the workpiece. In certain embodiments, the mask set comprises exactly two masks. In further embodiments, a union of the open portion of each of the exactly two masks comprises an entirety of the surface of the workpiece.

In another embodiment, a method of processing a workpiece is disclosed. The method comprises performing a first patterned ion implant using a mask into a surface of the workpiece, the mask having an open portion and a patterned portion; creating relative movement between the mask and the workpiece after performing the first patterned ion implant; and performing a second patterned ion implant using the mask into the surface, after the relative movement, such that after the first patterned ion implant and second patterned ion implant, an entirety of the surface of the workpiece is lightly doped and a pattern of more heavily doped regions is formed on the surface of the workpiece. In certain embodiments, the mask is translated, rotated or flipped after the first patterned ion implant. In certain embodiments, the workpiece is rotated after the first patterned ion implant. In a further embodiment, the open portion and the patterned portion each comprise 50% of the surface area of the workpiece. In certain embodiments, the open portion and the patterned portion are arranged symmetrically so that rotation or flipping of the mask produces a complementary mask, wherein a union of the open portion of the mask and an open portion of the complementary mask comprises an entirety of the surface of the workpiece.

BRIEF DESCRIPTION OF THE FIGURES

For a better understanding of the present disclosure, reference is made to the accompanying drawings, which are incorporated herein by reference and in which:

FIG. 2 shows a mask set according to a first embodiment;

FIG. 3 shows a mask set according to a second embodiment;

DETAILED DESCRIPTION

Figure 1A:
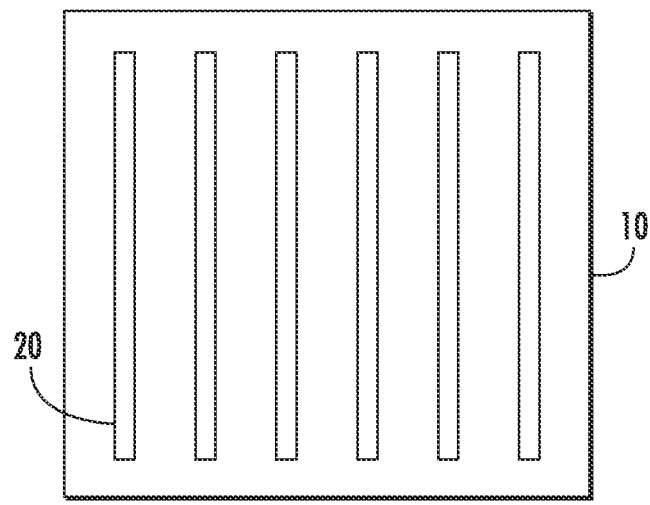
FIGS. 1A and 1B show two common configurations used for selective emitter surfaces for a solar cell.

As described above, certain types of solar cells, such as but not limited to selective emitter solar cells, are manufactured by creating a lightly doped surface that includes more heavily doped regions. These more heavily doped regions may be used to connect the metal contacts during a subsequent processing step. This pattern on the workpiece may be referred to as a selective emitter surface.

Ion implantation may be beneficially used to create this selective emitter surface. One or more dopant species may be implanted into the workpiece to create a lightly doped surface. Additional dopant species may be implanted into specific portions of this lightly doped surface to create the heavily doped selective emitter regions.

The apparatus used to perform the ion implant is not limited by this disclosure. For example, in one embodiment, a beam line ion implanter may be used. A beam line ion implanter has an ion source, which generates an ion beam. This ion beam is directed toward the workpiece. In some embodiments, the ion beam is mass analyzed so that only ions of a desired mass/charge are directed toward the workpiece. In other embodiments, the ion beam is not mass analyzed, allowed all ions to implant the workpiece. The ion beam energy may be controlled through the use of electrodes in the path of the ion beam which serve to accelerate or decelerate the ion beam, as desired. The ion beam may be in the form of a ribbon beam, where the width of the ion beam is much larger than its height. In other embodiments, the ion beam may be a spot beam or a scanned ion beam. The ion source may be a Bernas ion source, or may use inductive or capacitive coupling to generate the desired ions.

In another embodiment, the apparatus may be a plasma chamber, where the workpiece is disposed in the same chamber where the plasma is generated. The plasma may be generated using an RF source, although other techniques are also possible. The workpiece is then biased to attract ions from within the plasma toward the workpiece, so as to implant the desired ions in the workpiece. Other types of apparatus may also be used to perform these ion implantation processes.

Productivity and solar cell efficiency may be increased by performing these two or more implants without breaking vacuum. Multiple ions implants conducted in the same implant tool without breaking vacuum may be referred to as a "chained implant". In addition to reducing costs and improving productivity and solar cell efficiency, this method may further improve the dopant profiles. There are many different ways that chained implants may be incorporated into the solar cell production process. These processes may be performed in a beam-line ion implanter, which may be mass analyzed, or non-mass analyzed; a plasma chamber, or other ion implantation systems.

The present process comprises two or more ion implants, each of the ion implants performed using a mask. These ion implants, which use a mask, are referred to herein as "patterned implants". As used herein, the term "mask" refers to a shadow mask or a stencil mask, which is a physically separate component that can be disposed near, or in contact with, the workpiece during ion implantation. As such, the term "mask", as used herein, does not include a hard mask, which is formed directly on the substrate through deposition, or a soft mask, which is formed by the application of photoresist to the workpiece. This mask is used to selectively block portions of the workpiece from being implanted. The present disclosure describes the use of two or more patterned implants to create a selective emitter surface.

Figure 1B:
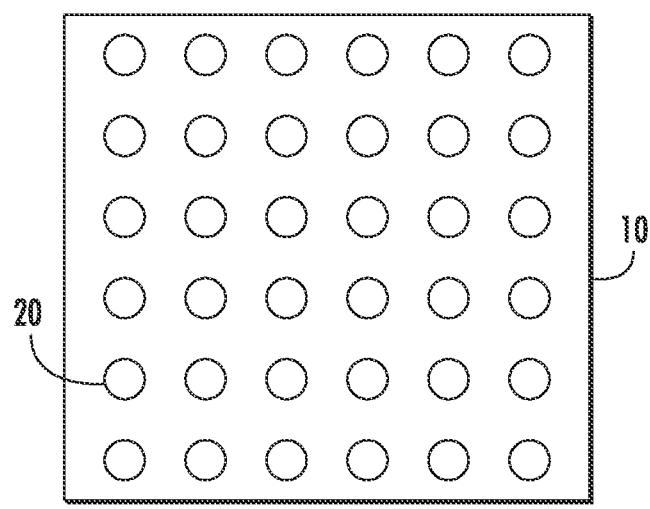

FIGS. 1A and 1B show two common configurations used for selective emitter surfaces. In both of these figures, the entirety of the surface of the workpiece 10 is lightly doped to a first concentration. This dopant concentration may be between $1E18/cm^3$ and $1E20/cm^3$, although this is not limited by this disclosure. More heavily doped regions 20 are doped to a higher level, which may be at least twice the dopant concentration of the rest of the workpiece 10. These more heavily doped regions are the selective emitters. FIG. 1A shows an embodiment where the heavily doped regions 20, or selective emitters, comprise a plurality of slots or stripes. FIG. 1B shows an embodiment where the heavily doped regions 20 comprise a pattern of dots or circular regions. Of course, other configurations of selective emitters are possible and are within the scope of the disclosure. These figures as well as the embodiments of FIGS. 2-6 are for illustrative purposes. The workpiece 10 and masks may have many more dots or stripes than are shown in these figures. Thus, these figures are merely representative of various embodiments and the disclosure is not limited to only these embodiments or figures.

A mask set is used to create the desired selective emitter surface by introducing a mask between the source of the ion beam and the workpiece. The mask set is one or more masks that are used to perform a plurality of chained patterned implants. Each mask comprises an open portion and may optionally comprise a patterned position. The patterned portion has a blocking material that includes apertures that correspond to the heavily doped regions 20, which may represent selective emitters, shown in FIGS. 1A-1B. The open position is a portion without any blocking material, such that ions are free to pass through the entirety of the open portion.

In some embodiments, two masks comprise a mask set. In these embodiments, the open portions of the two masks are complementary, in that the union of the open portions comprises the entirety of the surface to be implanted. Similarly, the patterned portions are complementary, in that the union of the patterned portions comprises the pattern of selective emitters to be implanted. Stated differently, when the mask set is used to perform a chained implant, the result is a lightly doped surface with more heavily doped regions 20, such as the pattern shown in FIGS. 1A-1B.

The two masks that comprise the mask set may be configured in a number of ways. FIG. 2 shows a first embodiment. In this embodiment, the first mask 100 comprises an open portion 101, which exposes most, but not all, of the workpiece 120. However, the first mask 100 has no patterned portion. The complementary second mask 110 comprises open portions 111, 112 disposed near the outer edges of the workpiece 120. The complementary second mask 110 also comprises a patterned portion 113, which creates the selective emitter pattern. When an ion implant is performed using the first mask 100, most of the workpiece 120 received a uniform first dose, except for narrow regions along the edges of the workpiece 120. The ion implant using the complementary second mask 110 provides the same first dose to the outer narrow regions of the workpiece 120 that were not implanted during the first ion implant. Thus, the union of the open portion 101 and the open portions 111, 112 comprises the entirety of the workpiece 120. In addition, the second patterned implant provides additional ions into the patterned portion 113, so as to create a pattern of slots having a higher dose that the rest of the surface of the workpiece 120. This mask set may be used to produce the selective emitter surface shown in FIG. 1A.

FIG. 2 shows a first configuration where the first mask 100 does not have a patterned portion. However, this may be achieved in other ways as well. For example, the first mask 100 may have an open portion 101 that extends all the way to the edge of the workpiece 120 on one of the two sides. In this way, the complementary second mask 110 may have an open portion 112 only on one side of the patterned portion 113. For example, the open portion of first mask 100 may extend beyond the left edge of the workpiece 120. In this embodiment, the open portion 112 of complementary second mask 110 would only be disposed on the right side of the patterned portion 113, and open portion 111 would be eliminated.

Of course, there are other embodiments where one of the masks may only have an open portion. FIG. 3 shows another embodiment where the first mask 200 comprises two open portions 201, 202, separated by a spacer 203. The second mask 210 comprises two patterned portions 211, 212 with a small open portion 213 disposed between these two patterned portions 211, 212. Again, the union of two open portions 201, 202 and small open portion 213 comprise the entirety of the surface of the workpiece 120.

Figure 4:
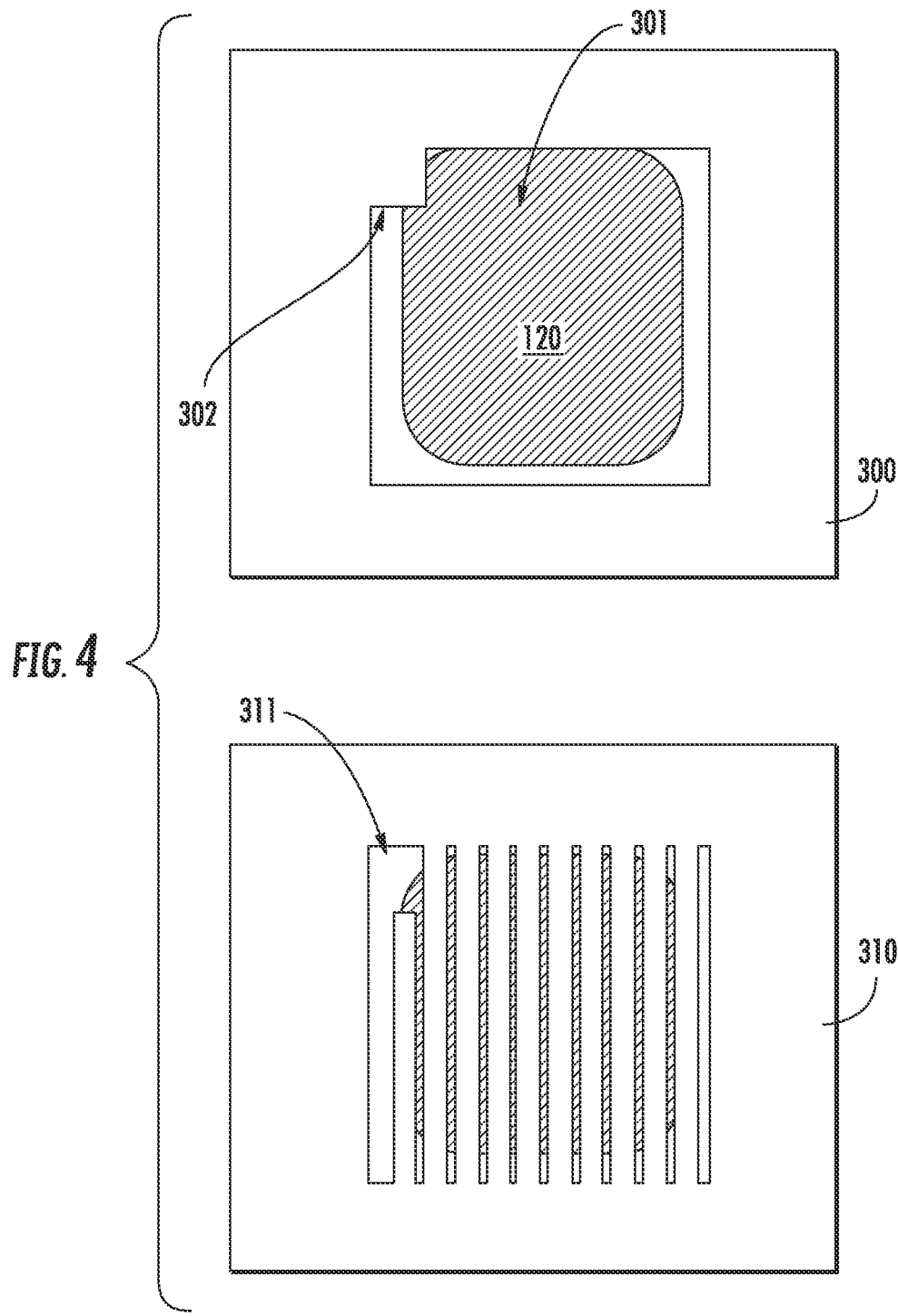
FIG. 4 shows a mask set according to a third embodiment.

FIG. 4 shows another embodiment where the first mask 300 comprises an open portion 301, with only a small region 302 that is blocked. The second mask 310 comprises a small open portion 311, which exists in the same space as the small region 302 of the first mask 300. The remainder of the second mask 310 comprises a patterned portion 312, which creates the selective emitter pattern of FIG. 1A.

FIGS. 2-4 show embodiments where two masks are used to create the selective emitter surface. Each of these figures discloses an embodiment where one of the masks comprises only one or more open portions, while the second mask comprises at least one open portion and at least one patterned portion. While each of the embodiments shown in FIGS. 2-4 is used to create a selective emitter in the shape of a slot (see FIG. 1A), the disclosure is not so limited. For example, the slots in complementary second mask 110 of FIG. 2 or in second mask 310 in FIG. 4 may be replaced with circular apertures to create the pattern shown in FIG. 1B.

Figure 5:
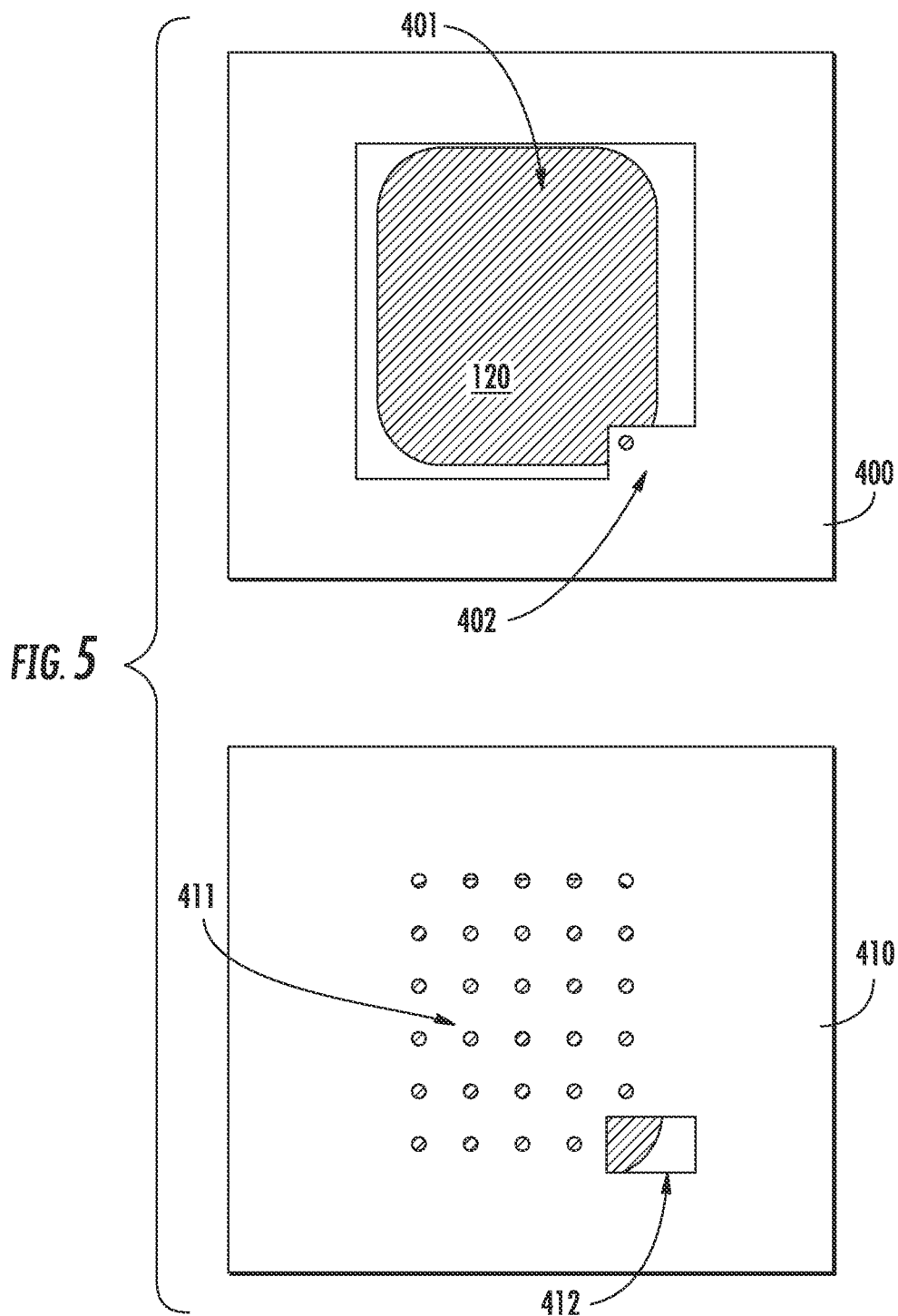
FIG. 5 shows a mask set according to a fourth embodiment.

In another embodiment, each of the two masks may comprise an open portion and a patterned portion. For example, FIG. 5 shows an embodiment where the first mask 400 comprises a large open portion 401 and a small patterned portion 402, which comprises a single circular aperture. However, the small patterned portion 402 may comprises any number of apertures and is not limited to the configuration shown in FIG. 5. The complementary second mask 410 comprises a large patterned portion 411, and a small open portion 412, disposed in the same location as the small patterned portion 402 of the first mask 400. Again, the union of the large open portion 401 and small open portion 412 comprises the entirety of the surface of the workpiece 120.

Of course, other configurations are also possible. For example, the small patterned portion 402 of the first mask 400 may be expanded to include a larger percentage of the surface of the workpiece 120. In this scenario, the small open portion 412 of the complementary second mask 410 would also expand by the same amount, so that the union of the large open portion 401 and small open portion 412 comprise the entirety of the surface of the workpiece 120.

Figure 6:
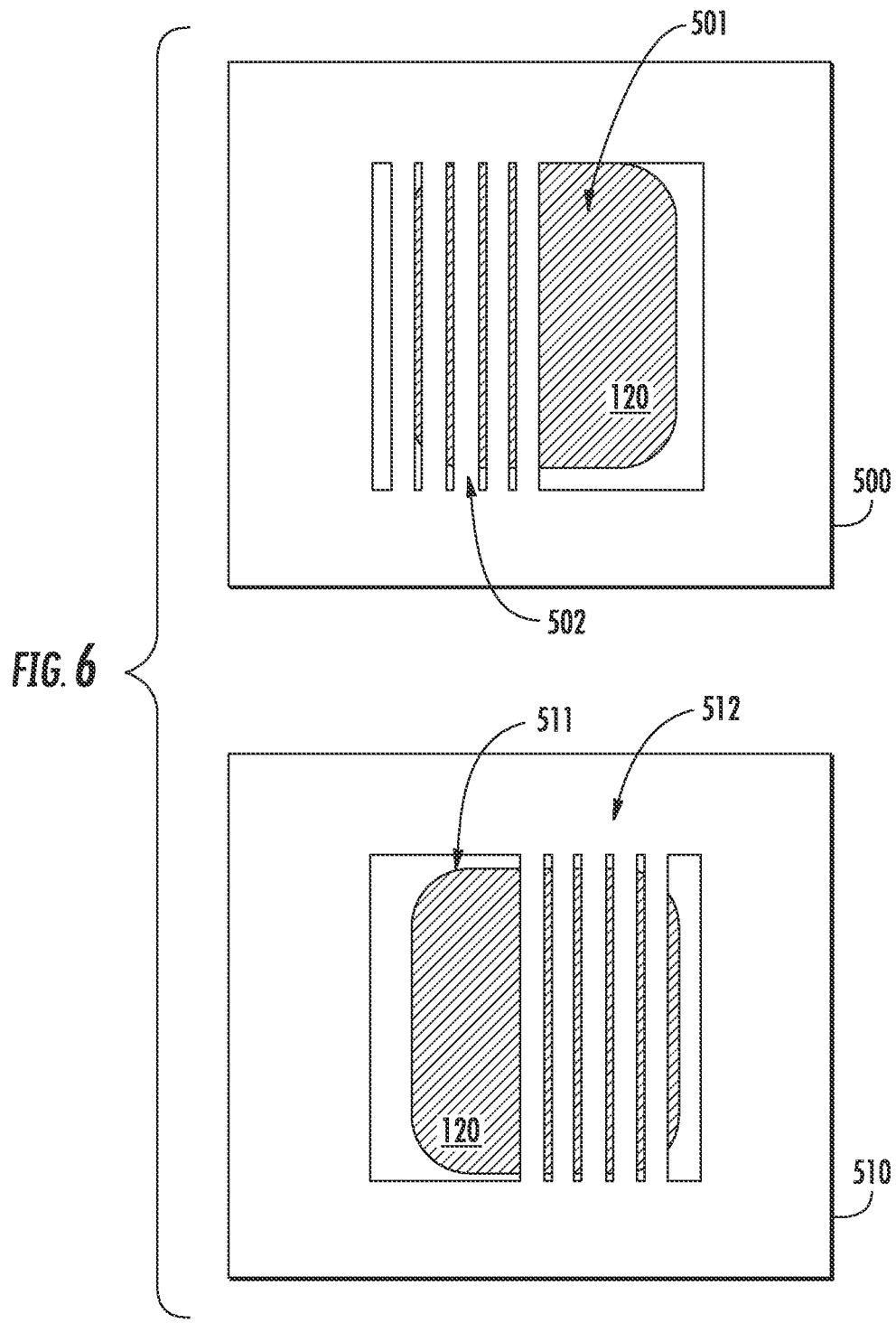
FIG. 6 shows a mask set according to a fifth embodiment.

FIG. 6 shows a special embodiment where the first mask 500 and the second mask 510 may be the same mask, simply rotated or flipped relative to the workpiece 120 between implants. First mask 500 has an open portion 501 on the right side and a patterned portion 502 on the left side, where each portion comprises 50% of the total surface area of the workpiece 120. The second mask 510 has an open portion 511 on the left side and a patterned portion 512 on the right side, where each portion comprises 50% of the total surface area of the underlying workpiece. By rotating the first mask 500 clockwise 180°, the second mask 510 is created. Thus, in this embodiment, the chained implant can be achieved in two different ways. First, two different masks, having the configurations shown in FIG. 6, may be used in two chained patterned implants. Second, the first implant can be performed using first mask 500. After this implant is completed, the first mask 500 may be rotated 180° relative to the workpiece 120, and the second chained patterned implant can be performed using the first mask 500 after it has been rotated. In this embodiment, the mask set used to perform the chained implant may comprise a single mask that is used in two different orientations. In another embodiment, the first mask 500 may be kept stationary, and the workpiece 120 may be rotated. Thus, two chained implants may be performed using a single mask by creating relative movement between the mask and the workpiece 120. In one embodiment, the first mask 500 may be flipped or rotated between the two implants to create second mask 510. In a second embodiment, the workpiece 120 may be rotated between the two implants.

Of course, the slots that comprise the patterned portions of the first mask 500 and second mask 510 in FIG. 6 may be replaced by circular apertures to produce the selective emitter surface of FIG. 1B. In addition, while FIG. 6 shows one special configuration where one mask may be used, there are other such embodiments. For example, the open and patterned portions may be oriented horizontally, where one is in the top half and the other portion is the bottom half. Alternatively, the two halves can be divided by a diagonal line. In fact, any configuration where the open portion and the patterned portion are each 50%, and are arranged symmetrically so that the rotation or flipping of the mask produces a complementary mask can be used.

Furthermore, while FIG. 6 shows a configuration where two identical (but rotated) masks may be used, there are other embodiments that are similar to the arrangement of FIG. 6 but utilize two different masks. For example, the open portion of first mask 500 may be expanded to comprise more than 50% of the surface of the workpiece 120. In this embodiment, the open portion of the second mask 510 would be reduced by the same amount, so that the union of the open portions of the two masks comprises the entirety of the surface of the workpiece.

In each of the above embodiments, to achieve a uniform lightly doped surface with more heavily doped regions, it may be beneficial to use the same dopant species, dopant energy, and dopant dose in each of the two chained patterned implants. However, it is also noted that in some embodiments, such as where the open portion is provided predominantly by one mask, including the configurations of FIGS. 2 and 4, it may be acceptable to perform the two chained implants using different dopant doses.

Thus, a method of performing two chained patterned implants is disclosed using a mask set, where the result of these two patterned implants is a workpiece having a surface that is uniformly or nearly uniformly lightly doped with more heavily doped regions that may serve as selective emitters. As described above, these implants may be performed without breaking vacuum in the ion implantation apparatus.

In addition, a mask set is described. After a workpiece has been subjected to patterned implanted using each mask of the mask set, the workpiece comprises a lightly doped surface with more heavily doped regions that may serve as selective emitters.

The previous disclosure described a chained patterned implant comprising two masks, or one mask that is rotated or flipped between the implants. However, the disclosure is not so limited. For example, three or more masks may be used to perform the disclosed method. As described above, the union of the open portions of all of these masks comprises the entirety of the surface of the workpiece to be implanted. This can be achieved by having an open portion in each mask, or only in a subset of the masks. This subset may be at least two masks or may be a single mask that is translated, rotated or flipped between implants. Similarly, a patterned portion may exist on all of the masks, or any subset thereof.

When three or more masks are used, a closed portion may be included on one or more of the masks. A closed portion is a region with no apertures so that no ions may pass through. In one embodiment, each of three masks has a patterned portion, a closed portion and an open portion. In another embodiment, only two of the masks have an open portion, while the third mask comprises only a patterned portion. In this embodiment, the two masks with an open portion may or may not have a patterned portion. For example, in one embodiment, a first mask may be an open portion that comprises 60% of the area and a closed portion that comprises the rest of the area. The second mask may be an open portion that comprises 40% of the area, such that the union of these two open portions comprises the entirety of the surface of the workpiece being implanted. In this embodiment, the third mask may be a patterned portion that comprises the entire surface. Of course, more embodiments are readily attainable where the union of the open portions of each of the masks of the mask set comprises the entirety of the surface of the workpiece to be implanted.

While the above disclosure indicates that the union of the open portions comprises the entirety of the surface, it is understood that the phrase "the entirety of the surface" includes the entirety of the surface, as well as nearly the entirety of the surface. In some embodiments, it may be acceptable to not dope certain small regions at all, such as one or more of the corners of the workpiece. The phrase "the entirety of the surface" is intended to encompass these embodiments as well.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of processing a workpiece comprising:
performing a plurality of patterned ion implants into a surface of said workpiece so as to create a lightly doped surface having a pattern of more heavily doped regions, wherein said performing comprises:
implanting ions into said workpiece using a first mask and implanting ions into said workpiece using a second mask, different from said first mask, where said first mask and said second mask each comprises an open portion through which ions may pass and at least one of said first mask and said second mask comprises a patterned portion, and where a union of said open portion of said first mask and said open portion of said second mask comprises an entirety of said surface of said workpiece.

2. The method of claim 1, wherein said plurality of patterned ion implants are performed without breaking vacuum of an implant apparatus used to perform said plurality of patterned ion implants.

3. The method of claim 1, wherein only said second mask comprises said patterned portion.

4. The method of claim 1, wherein said second mask comprises said patterned portion and said first mask comprises said patterned portion.

5. The method of claim 1, wherein said entirety of said surface is lightly doped by ions passing through said open portion and said more heavily doped regions are formed by ions passing through said patterned portion.

6. A mask set for implanting a surface of a workpiece, wherein said mask set comprises exactly two masks, wherein each mask of said mask set comprises an open portion, and at least one mask in said mask set comprises a patterned portion, wherein after said workpiece is implanted using each mask of said mask set, an entirety of said surface of said workpiece is lightly doped and a pattern of more heavily doped regions is formed on said surface of said workpiece, and wherein a union of said open portion of each of said exactly two masks comprises an entirety of said surface of said workpiece.

7. The mask set of claim 6, wherein said patterned portion comprises a plurality of slots.

8. The mask set of claim 6, wherein said patterned portion comprise a plurality of dots.

9. The mask set of claim 6, where only one of said exactly two masks comprises a patterned portion.

10. The mask set of claim 6, wherein said entirety of said surface is lightly doped by ions passing through said open portions and said more heavily doped regions are formed by ions passing through said patterned portions.

11. A method of processing a workpiece, comprising:
performing a first patterned ion implant using a mask into a surface of said workpiece, said mask having an open portion and a patterned portion, wherein ions pass through the open portion and the patterned portion and implant said workpiece during said first patterned ion implant;
creating relative movement between said mask and said workpiece after performing said first patterned ion implant; and
performing a second patterned ion implant using said mask into said surface, after said relative movement, wherein ions pass through the open portion and the patterned portion and implant said workpiece during said second patterned ion implant
such that after said first patterned ion implant and second patterned ion implant, an entirety of said surface of said workpiece is lightly doped and a pattern of more heavily doped regions is formed on said surface of said workpiece.

12. The method of claim 11, wherein said mask is translated, rotated or flipped after said first patterned ion implant.

13. The method of claim 11, wherein said workpiece is rotated after said first patterned ion implant.

14. The method of claim 11, wherein said open portion and said patterned portion each comprises 50% of a surface area of said workpiece.

15. The method of claim 14, wherein said open portion and said patterned portion are arranged symmetrically so that rotation or flipping of said mask produces a complementary mask, wherein a union of said open portion of said mask and an open portion of said complementary mask comprises an entirety of said surface of said workpiece.

\* \* \* \* \*